United States Patent
Cao et al.

(10) Patent No.: US 9,680,116 B2
(45) Date of Patent: Jun. 13, 2017

(54) CARBON NANOTUBE VACUUM TRANSISTORS

(71) Applicant: International Business Machines Corporation, Armonk, NY (US)

(72) Inventors: Qing Cao, Yorktown Heights, NY (US); Kangguo Cheng, Schenectady, NY (US); Zhengwen Li, Scarsdale, NY (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/843,332

(22) Filed: Sep. 2, 2015

(65) Prior Publication Data

US 2017/0062743 A1   Mar. 2, 2017

(51) Int. Cl.
| | | |
|---|---|---|
| *H01J 21/06* | (2006.01) | |
| *H01L 29/06* | (2006.01) | |
| *H01L 51/05* | (2006.01) | |
| *H01L 51/00* | (2006.01) | |
| *H01J 21/10* | (2006.01) | |

(52) U.S. Cl.
CPC ........ *H01L 51/0558* (2013.01); *H01J 21/105* (2013.01); *H01L 29/0673* (2013.01); *H01L 51/0017* (2013.01); *H01L 51/0545* (2013.01)

(58) Field of Classification Search
CPC ............. H01L 51/0017; H01L 51/0048; H01L 51/0545; H01L 51/0558; H01J 21/00–21/36; H01J 19/00–19/82
See application file for complete search history.

(56) References Cited

U.S. PATENT DOCUMENTS

| 4,827,177 A | * | 5/1989 | Lee | H01J 21/105 |
| | | | | 313/306 |
| 5,214,346 A | * | 5/1993 | Komatsu | H01J 21/105 |
| | | | | 313/309 |
| 6,297,592 B1 | | 10/2001 | Goren et al. | |
| 6,437,360 B1 | * | 8/2002 | Cho | H01J 1/316 |
| | | | | 257/10 |

(Continued)

OTHER PUBLICATIONS

Han et al., "Vacuum nanoelectronics Back to the future?—Gate insulated nanoscale vacuum channel transistor," Applied Physics Letters, vol. 100, No. 21 pp. 213505-1-213505-4 (May 2012).

(Continued)

*Primary Examiner* — Eric Ward
(74) *Attorney, Agent, or Firm* — Vazken Alexanian; Michael J. Chang, LLC

(57) ABSTRACT

Vacuum transistors with carbon nanotube as the collector and/or emitter electrodes are provided. In one aspect, a method for forming a vacuum transistor includes the steps of: covering a substrate with an insulating layer; forming a back gate(s) in the insulating layer; depositing a gate dielectric over the back gate; forming a carbon nanotube layer on the gate dielectric; patterning the carbon nanotube layer to provide first/second portions thereof over first/second sides of the back gate, separated from one another by a gap G, which serve as emitter and collector electrodes; forming a vacuum channel in the gate dielectric; and forming metal contacts to the emitter and collector electrodes. Vacuum transistors are also provided.

16 Claims, 4 Drawing Sheets

(56) References Cited

U.S. PATENT DOCUMENTS

| | | |
|---|---|---|
| 6,803,725 B2 | 10/2004 | Jin |
| 6,891,320 B2 | 5/2005 | Nakamoto |
| 7,102,157 B2 | 9/2006 | Kastalsky et al. |
| 7,176,478 B2 * | 2/2007 | Kastalsky .............. B82Y 10/00 257/9 |
| 7,382,648 B2 * | 6/2008 | Bockrath .............. B81B 3/0021 365/151 |
| 7,714,240 B1 * | 5/2010 | Roesler ................. H01J 21/105 200/181 |
| 7,816,848 B2 * | 10/2010 | Liu ......................... H01J 1/316 313/310 |
| 8,115,187 B2 * | 2/2012 | Segal ..................... H01J 3/021 257/4 |
| 8,564,048 B2 | 10/2013 | Rinzler et al. |
| 8,624,224 B2 | 1/2014 | Kastalsky |
| 9,029,211 B2 * | 5/2015 | Xiao .................. H01L 29/0665 257/327 |
| 9,099,274 B2 * | 8/2015 | Lee ......................... H01J 1/316 |
| 9,147,755 B1 * | 9/2015 | Han .................. H01L 29/66977 |
| 2008/0030117 A1 * | 2/2008 | Chen ....................... H01J 3/021 313/311 |
| 2011/0268884 A1 * | 11/2011 | Wind ..................... B82Y 10/00 427/272 |

OTHER PUBLICATIONS

Srisonphan et al., "Metal-oxide-semiconductor field-effect transistor with a vacuum channel," Nature Nanotechnology, vol. 7, No. 8, pp. 504-508 (Jul. 2012).

Bonard et al., "Field emission from carbon nanotubes: perspectives for applications and clues to the emission mechanism," Appl. Phys. A, vol. 69, No. 3, pp. 245-254 (Jul. 1999).

Zhu et al., "Large current density from carbon nanotube field emitters," Applied Physics Letters, vol. 75, No. 6, pp. 873-875 (Aug. 1999).

Park et al., "High-density integration of carbon nanotubes via chemical self-assembly," nature nanotechnology 7, 787-791 (Oct. 2012).

Park et al., "A New Slit-Type Vacuum-Channel Transistor," IEEE Transactions on Electron Devices, vol. 61, No. 12, Dec. 2014, pp. 4186-4191.

* cited by examiner

CARBON NANOTUBE VACUUM TRANSISTORS

FIELD OF THE INVENTION

The present invention relates to vacuum transistors, and more particularly, to vacuum transistors with carbon nanotube as the collector and/or emitter electrodes.

BACKGROUND OF THE INVENTION

In vacuum transistors, the traditional semiconductor channel material commonly found in field effect transistors is replaced with a vacuum channel. See, for example, Han et al., "Vacuum nanoelectronics" Back to the future?—Gate insulated nanoscale vacuum channel transistor," Applied Physics Letters 100, pgs. 213505-1-213505-4 (May 2012).

Vacuum transistors are useful for the next generation high speed and low-power electronics. For instance, vacuum transistors offer high speed performance with the potential to reach terahertz (THz) operation with zero body-to-gate-capacitance and ballistic transport of electrons. They operate at low power with the potential to achieve sub-threshold swing less than 60 millivolts per decade (mV/dec) with scaled dielectrics.

However, conventional vacuum transistors have several notable drawbacks. High voltage is needed to induce field emission. For instance, 1-10 volts are needed for current silicon-based devices. These devices also have a low field emission current density. See, for example, Srisonphan et al., "Metal-oxide-semiconductor field-effect transistor with a vacuum channel," Nature Nanotechnology 7, 504-508 (July 2012).

Therefore, improved vacuum transistor designs which do not suffer from the above-described drawbacks would be desirable.

SUMMARY OF THE INVENTION

The present invention provides vacuum transistors with carbon nanotube as the collector and/or emitter electrodes. In one aspect of the invention, a method for forming a vacuum transistor is provided. The method includes the steps of: covering a substrate with an insulating layer; forming at least one back gate in the insulating layer; depositing a gate dielectric on the insulating layer over the back gate; forming a carbon nanotube layer on the gate dielectric over the back gate; patterning the carbon nanotube layer to provide a first portion of the carbon nanotube layer over a first side of the back gate and a second portion of the carbon nanotube layer over a second side of the back gate, wherein the first portion of the carbon nanotube layer and the second portion of the carbon nanotube layer are separated from one another by a gap G, and wherein the first portion of the carbon nanotube layer serves as an emitter electrode of the vacuum transistor and the second portion of the carbon nanotube layer serves as a collector electrode of the vacuum transistor; forming a vacuum channel in the gate dielectric over the back gate; and forming metal contacts to the emitter electrode and to the collector electrode.

In another aspect of the invention, another method for forming a vacuum transistor is provided. The method includes the steps of: covering a substrate with an insulating layer; forming at least one back gate in the insulating layer; depositing a gate dielectric on the insulating layer over the back gate; forming a carbon nanotube layer on the gate dielectric over the back gate; patterning the carbon nanotube layer to provide a portion of the carbon nanotube layer over only a first side of the back gate, wherein the portion of the carbon nanotube layer serves as an emitter electrode of the vacuum transistor; forming a vacuum channel in the gate dielectric over the back gate; forming a first metal contact to the emitter electrode; and forming a second metal contact on the gate dielectric over a second side of the back gate, wherein the second metal contact serves as a collector electrode of the vacuum transistor, and wherein the portion of the carbon nanotube layer and the second metal contact are separated from one another by a gap G'.

In yet another aspect of the invention, a vacuum transistor is provided. The vacuum transistor includes: a substrate covered with an insulating layer; at least one back gate formed in the insulating layer; a gate dielectric on the insulating layer over the back gate; a carbon nanotube layer on the gate dielectric over the back gate; a first carbon nanotube layer on the gate dielectric over a first side of the back gate; a second carbon nanotube layer on the gate dielectric over a second side of the back gate, wherein the first carbon nanotube layer and the second carbon nanotube layer are separated from one another by a gap G, and wherein the first carbon nanotube layer serves as an emitter electrode of the vacuum transistor and the second carbon nanotube layer serves as a collector electrode of the vacuum transistor; a vacuum channel in the gate dielectric over the back gate; and metal contacts to the emitter electrode and to the collector electrode.

In still yet another aspect of the invention, another vacuum transistor is provided. The vacuum transistor includes: a substrate covered with an insulating layer; at least one back gate formed in the insulating layer; a gate dielectric on the insulating layer over the back gate; a carbon nanotube layer on the gate dielectric over only a first side of the back gate, wherein the carbon nanotube layer serves as an emitter electrode of the vacuum transistor; a vacuum channel in the gate dielectric over the back gate; a first metal contact to the emitter electrode; and a second metal contact on the gate dielectric over a second side of the back gate, wherein the second metal contact serves as a collector electrode of the vacuum transistor, and wherein the carbon nanotube layer and the second metal contact are separated from one another by a gap G'.

A more complete understanding of the present invention, as well as further features and advantages of the present invention, will be obtained by reference to the following detailed description and drawings.

DETAILED DESCRIPTION OF PREFERRED EMBODIMENTS

Provided herein are carbon nanotube-based vacuum transistors, wherein a carbon nanotube serves as the emitter and/or collector electrodes in the device. Because of the one-dimensional nature of carbon nanotube electrodes used in the present devices, the voltage needed to induce field emission is much lower as compared with traditional silicon-based devices. Namely, the field focusing effect caused by the nanometer size tip of the carbon nanotubes greatly reduces the voltage required for field emission. See, for example, Bonard et al., "Field emission from carbon nanotubes: perspectives for applications and clues to the emission mechanism," Appl. Phys. A 69, 245-254 (July 1999) (hereinafter "Bonard"), the contents of which are incorporated by reference as if fully set forth herein. Specifically, Table 1 in Bonard shows the turn-on and threshold fields calculated as a function of voltage and electrode distance for nanotube samples, which suggests that a voltage of less than 0.1 volts is expected for devices with a channel less than 50 nanometers (nm).

Further, carbon nanotubes have been shown experimentally to achieve a field emission current density of up to about $1\times10^5 \sim 1\times10^7$ ampere per square centimeter ($A/cm^2$). See, for example, Zhu et al., "Large current density from carbon nanotube field emitters," Applied Physics Letters, volume 75, no. 6, pgs. 873-875 (August 1999), the contents of which are incorporated by reference as if fully set forth herein.

Figure 1:
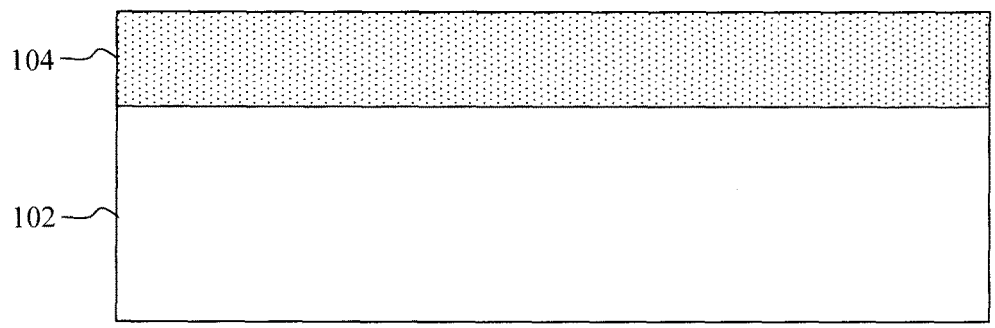
FIG. 1 is a cross-sectional diagram illustrating a starting platform for fabricating the present vacuum transistors which includes a substrate covered with a dielectric layer according to an embodiment of the present invention.

A first exemplary embodiment is now described by way of reference to FIGS. 1-6. As shown in FIG. 1, the starting platform for fabricating the present vacuum transistors is a substrate 102 covered with a insulating layer 104. By way of example only, the substrate 102 can be a semiconductor substrate, such as a silicon (Si), germanium (Ge), or silicon germanium (SiGe) substrate. Insulating layer 104 may be formed from an insulating material, such as silicon nitride ($SiN_x$) or silicon dioxide ($SiO_2$).

Figure 2:
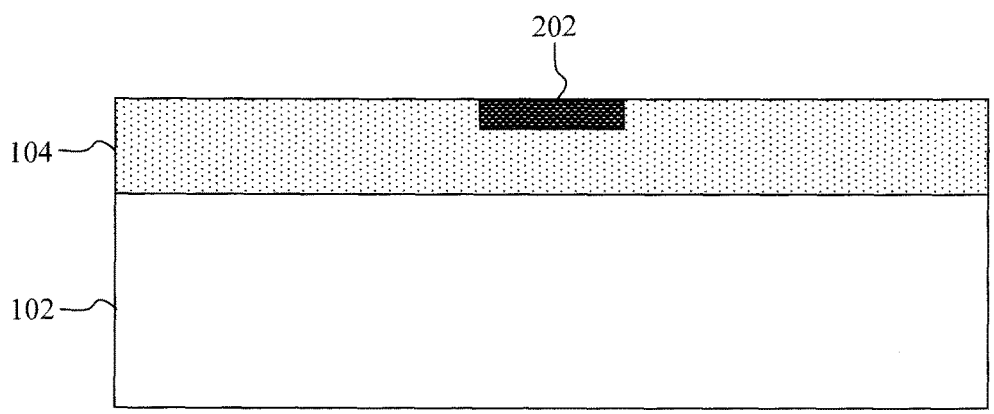
FIG. 2 is a cross-sectional diagram illustrating at least one back gate having been formed in the dielectric layer according to an embodiment of the present invention.
Figure 3:
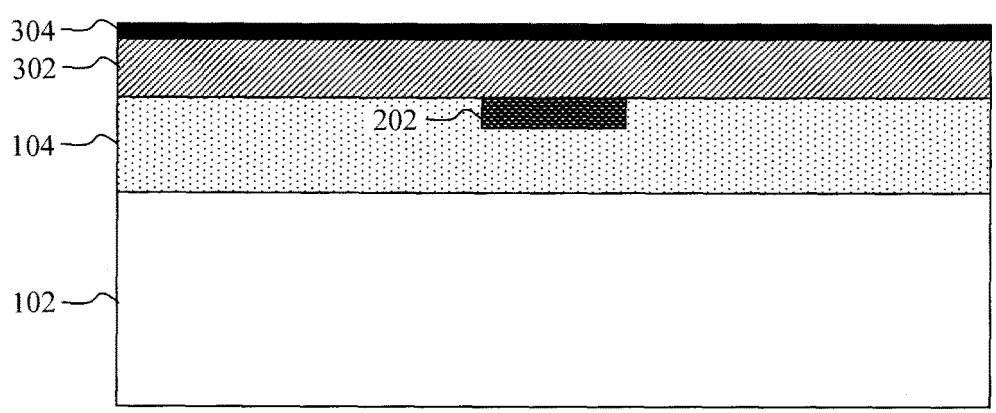
FIG. 3 is a cross-sectional diagram illustrating a gate dielectric having been deposited onto the insulating layer, and a layer of carbon nanotubes having been formed on the gate dielectric according to an embodiment of the present invention.

Next, as shown in FIG. 2, at least one back gate 202 is formed in the insulating layer 104. According to an exemplary embodiment, a damascene process is used to form the back gate 202 in the insulating layer 104, whereby the insulating layer 104 is first patterned with the footprint and location of the back gate 202. The pattern is then filled with a suitable gate metal, such as tungsten (W). Excess gate metal can be removed such that the top surface of the back gate 202 is coplanar with the top surface of the insulating layer 104. See FIG. 2. The excess gate metal can be removed using a planarization process, such as chemical mechanical polishing (CMP), where the insulating layer 104 acts as a stop layer. As a result, the back gate 202 will be embedded within the insulating layer 104. Specifically, as shown in FIG. 2, a portion of the insulating layer 104 will separate the back gate 202 from the substrate 102.

A gate dielectric 302 is then deposited onto the insulating layer 104, covering the back gate 202. See FIG. 3. As described above, the back gate 202 is preferably a metal gate. In that case, according to an exemplary embodiment, the gate dielectric 302 is a high-κ material. The term "high-κ," as used herein, refers to a material having a relative dielectric constant κ which is much higher than that of silicon dioxide (e.g., a dielectric constant κ=25 for hafnium oxide rather than 4 for silicon dioxide). Suitable high-κ dielectrics include, but are not limited to, hafnium oxide ($HfO_2$) and lanthanum oxide ($La_2O_3$).

A layer of carbon nanotubes 304 is then formed on the gate dielectric 302. According to an exemplary embodiment, the carbon nanotubes are single-walled or multi-walled nanotubes. As is known in the art, single-walled nanotubes consist of a single layer of rolled-up graphene and multi-walled nanotubes consist of concentric layers of graphene. By way of example only, the carbon nanotubes can be deposited onto the gate dielectric 302 from a solution containing the carbon nanotubes dispersed in a solvent using, e.g., spray-coating. It may be desirable to form the layer of carbon nanotubes 304 only in the active region(s) of the device (i.e., the region shown in FIG. 3). In that case, the carbon nanotubes can be cast onto the gate dielectric 302 through a mask. Alternatively, directed self assembly techniques can be employed to selectively place the carbon nanotubes. See, for example, Park et al., "High-density integration of carbon nanotubes via chemical self-assembly," nature nanotechnology 7, 787-791 (October 2012) (hereinafter "Park"), the contents of which are incorporated by reference as if fully set forth herein. Park describes a process by which carbon nanotubes are solubilized in water using sodium dodecyl sulfate (SDS) as an anionic surfactant which can mediate assembly of the carbon nanotubes based on an interaction with a positively charged surface.

Figure 4:
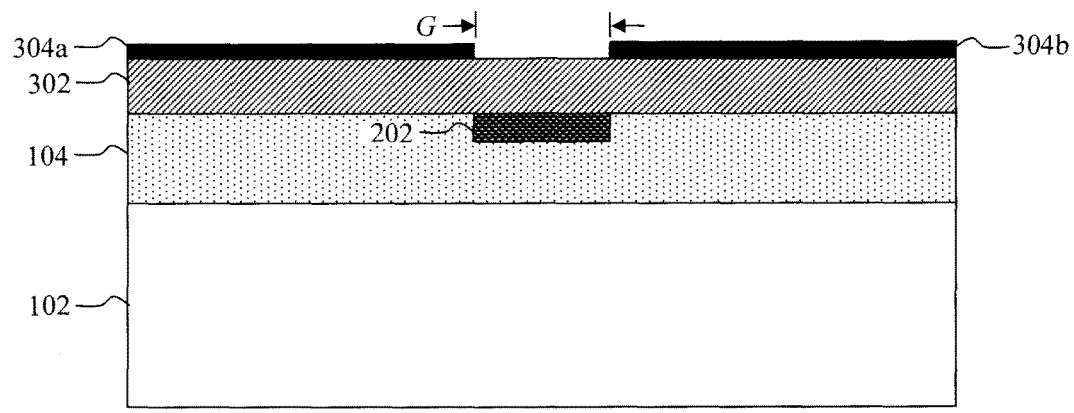
FIG. 4 is a cross-sectional diagram illustrating the layer of carbon nanotubes having been patterned to remove a portion of the layer over the back gate, resulting in the formation of two distinct portions of the layer one on each side of the back gate separated by a gap G according to an embodiment of the present invention.

The layer of carbon nanotubes 304 is then patterned to remove a portion of the layer over the back gate 202. See FIG. 4. As shown in FIG. 4, this patterning results in the formation of two distinct portions 304a and 304b of the layer of carbon nanotubes 304, one on each side of the back gate 202. As will be described in detail below, in this particular example these portions 304a/304b of the carbon nanotube layer will serve as emitter and collector electrodes of the vacuum transistor device, and will be present on opposite sides of a vacuum channel of the device. According to an exemplary embodiment, post-patterning, the portions 304a and 304b are separated by a gap G of from about 5 nm to about 100 nm, and ranges therebetween.

By way of example only, the layer of carbon nanotubes 304 can be patterned using standard photolithography followed by oxygen plasma etching. Namely, conventional photolithography techniques can be used to form a resist (not shown) on the layer of carbon nanotubes 304 patterned with the footprint and location of the gap G. An oxygen plasma etch can then be performed through the patterned photoresist to remove the uncovered portions of layer 304. The result is as shown in FIG. 4.

The vacuum channel is next formed in the gate dielectric 302 under the gap G, and over the back gate 202. See FIG. 5. A second etching step (i.e., the first step being the etching of the carbon nanotube layer) is used to pattern the gate dielectric 302. Patterning of the gate dielectric 302 can be carried out using standard lithography and etching techniques. For instance, a standard photoresist mask (not shown) can be formed over the portions 304a and 304b of the carbon nanotube layer that is patterned with the footprint and location of the vacuum channel. An etch through the patterned photoresist can then be performed to form the vacuum channel in the gate dielectric 302.

Figure 5:
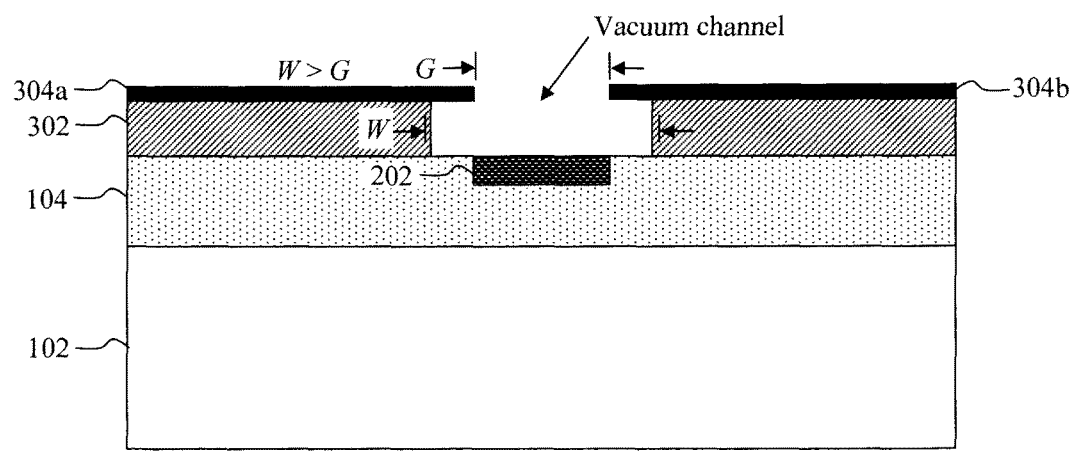
FIG. 5 is a cross-sectional diagram illustrating a vacuum channel having been formed in the gate dielectric under the gap G, and over the back gate according to an embodiment of the present invention.
Figure 6:
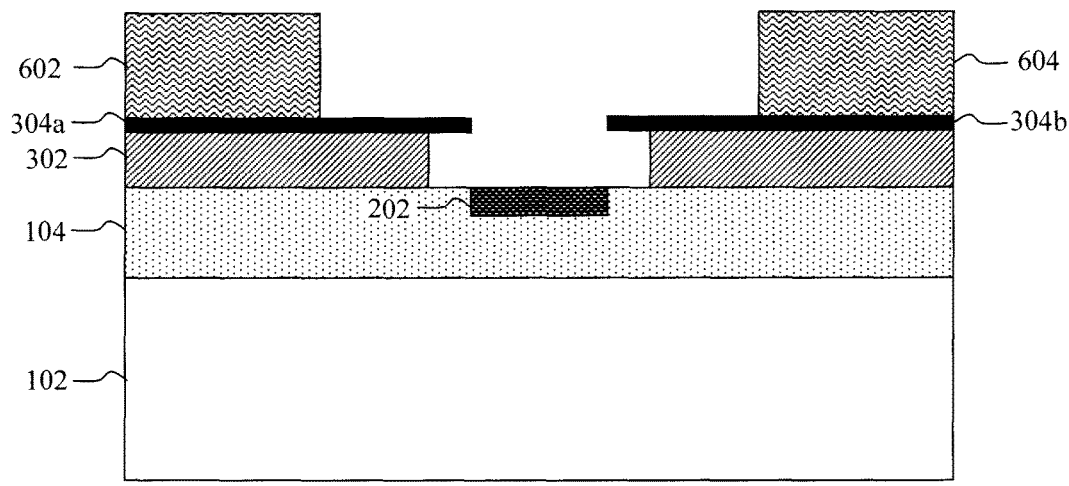
FIG. 6 is a cross-sectional diagram illustrating metal contacts having been formed to the portions of the carbon nanotube layer, i.e., the emitter and collector electrodes of the device, respectively according to an embodiment of the present invention.

According to an exemplary embodiment, the vacuum channel is formed having a width W that is greater than the gap G separating the portions 304a and 304b of the carbon nanotube layer. See FIG. 5. To achieve this configuration, an isotropic etch process such as wet or chemical etching may be employed. Further, as shown in FIG. 5, an etch chemistry is chosen which is selective for the gate dielectric vis-à-vis the insulating layer 104. One skilled in the art would be able to determine a proper selective etch chemistry given a particular set of materials chosen for these dielectric layers. According to an exemplary embodiment, the width W of the vacuum channel is from about 10 nm to about 150 nm, and ranges therebetween.

Next, metal contacts 602 and 604 are formed to the portions 304a and 304b of the carbon nanotube layer, i.e., the emitter and collector electrodes of the device, respectively. See FIG. 6. Any suitable metallization process may be employed to form the contacts 602 and 604, such as sputtering, evaporation, electroplating, etc. For instance, a lift-off process may be employed whereby a suitable contact metal (e.g., palladium (Pd), rhodium (Rh), titanium (Ti), copper (Cu), tungsten (W), tantalum (Ta), etc.) is deposited onto the structure through a mask. The mask can then be removed, and with it the excess metal.

During operation of the device, the emitter (i.e., portion 304a of the carbon nanotube layer) injects carriers into the vacuum channel. Movement of the carriers in the vacuum channel between the emitter and the collector (i.e., portion 304b of the carbon nanotube layer) is regulated by the back gate 202. Since the dimensions of the vacuum channel (see, e.g., the gap G dimensions provided above) is small enough to be less than the mean-free path in air, one does not need to provide an external vacuum to operate the device and the emitted carriers travel from the emitter to the collector without being scattered.

In the example just described, the carbon nanotube layer is used to form both the emitter and collector electrodes of the vacuum transistor device. Configurations are also contemplated herein where the carbon nanotube layer forms only the emitter electrode (with the metal contact on the opposite side of the vacuum channel serving as the collector electrode). An example involving such a device is now described by way of reference to FIGS. 7-11.

The starting platform for fabricating this vacuum transistor is the same as in the example above, namely a substrate 702 covered with an insulating layer 704. As provided above, the substrate 702 can be a semiconductor substrate, such as a Si, Ge, or SiGe substrate, and the insulating layer 704 may be formed from an insulating material, such as silicon nitride ($SiN_x$) or $SiO_2$.

Figure 7:
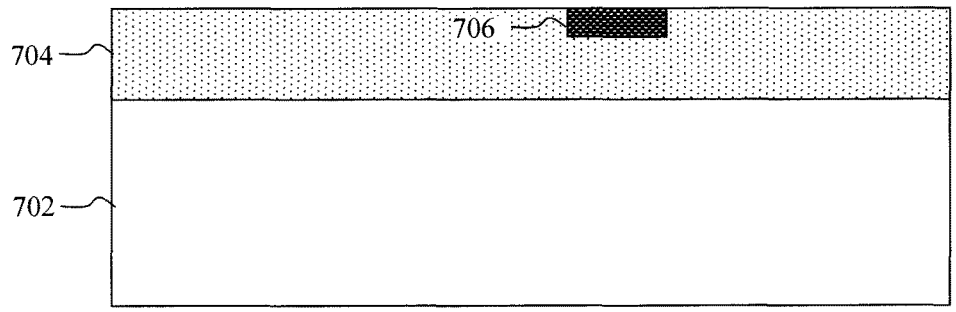
FIG. 7 is a cross-sectional diagram illustrating, according to an alternative embodiment, a starting platform for fabricating the present vacuum transistors which includes a substrate covered with an insulating layer, and at least one back gate having been formed in the dielectric layer according to an embodiment of the present invention.

Next, at least one back gate 706 is formed in the insulating layer 704. As shown in FIG. 7, the positioning of the back gate 706 is slightly different from that shown in the example above. This is because the carbon nanotube layer will be present on only one side (the emitter side in this example) of the back gate/vacuum channel. What is important however is the relation of the back gate 706 relative to the carbon nanotube layer such that when the gap is patterned in the carbon nanotube layer, that gap is present over the back gate 706—without the carbon nanotube layer being present on one side (the collector side in this example) of the back gate/vacuum channel.

As provided above, a damascene process may be used to form the back gate 706 in the insulating layer 704, whereby the insulating layer 704 is first patterned with the footprint and location of the back gate 706, followed by the pattern being filled with a suitable gate metal, such as W. Excess deposited gate metal can then be removed using etching planarization process, such as CMP, such that the top surface of the back gate 706 is coplanar with the top surface of the insulating layer 704. See FIG. 7. As shown in FIG. 7, the back gate 706 is now embedded within the insulating layer 704 with a portion of the insulating layer 704 separating the back gate 706 from the substrate 702.

In the same manner as described above, a gate dielectric 804 is then deposited onto the insulating layer 704, covering the back gate 706. See FIG. 8. When the back gate 706 is a metal gate (see above), the gate dielectric 804 is preferably a high-κ material, such as $HfO_2$ or $La_2O_3$.

Figure 8:
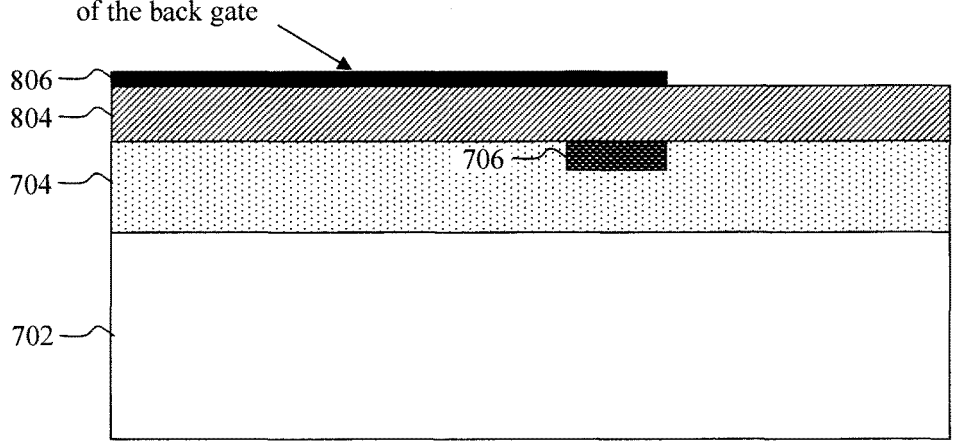
FIG. 8 is a cross-sectional diagram illustrating a gate dielectric having been deposited onto the dielectric layer, covering the back gate, and a layer of carbon nanotubes having been formed on the gate dielectric over one side (i.e., a first side) of the back gate according to an embodiment of the present invention.

A layer of carbon nanotubes 806 is then formed on the gate dielectric 804. According to an exemplary embodiment, the carbon nanotubes are single-walled or multi-walled nanotubes. As shown in FIG. 8, in this particular example the layer of carbon nanotubes 806 does not cover the gate dielectric 804 on both sides of the back gate 706. Compare this configuration with that shown, for example, in FIG. 3 where the layer of carbon nanotubes 304 covers the gate dielectric 302 on both sides of the back gate 202. By forming the layer of carbon nanotubes 806 over only one side of back gate 706, when the subsequent etch is performed to pattern the layer of carbon nanotubes 806 over the back gate 706 (see below), none of the carbon nanotubes will be present on one side (in this case the collector side) of the back gate 706. It is notable that, as shown in FIG. 8, the layer of carbon nanotubes 806 can be formed extending over the top surface of the back gate 706, however it does not extend beyond the collector-side edge of the back gate 706.

As provided above, the carbon nanotubes can be deposited onto the gate dielectric 804 from a solution containing the carbon nanotubes dispersed in a solvent using, e.g., spray-coating. Further, as provided above, techniques known in the art, such as depositing the carbon nanotubes through a mask, directed self-assembly through carbon nanotube surface functionalization (i.e., as described in Park), etc. may be employed to selectively place the carbon nanotubes on a certain portion of the gate dielectric 804. Selective placement capabilities are especially relevant in this case where, as described above, the layer of carbon nanotubes 806 should not extend beyond the collector-side edge of the back gate 706. For ease and clarity of description, the emitter and collector sides of the back gate, vacuum channel, etc. might also be referred to herein as first and second sides, respectively.

Figure 9:
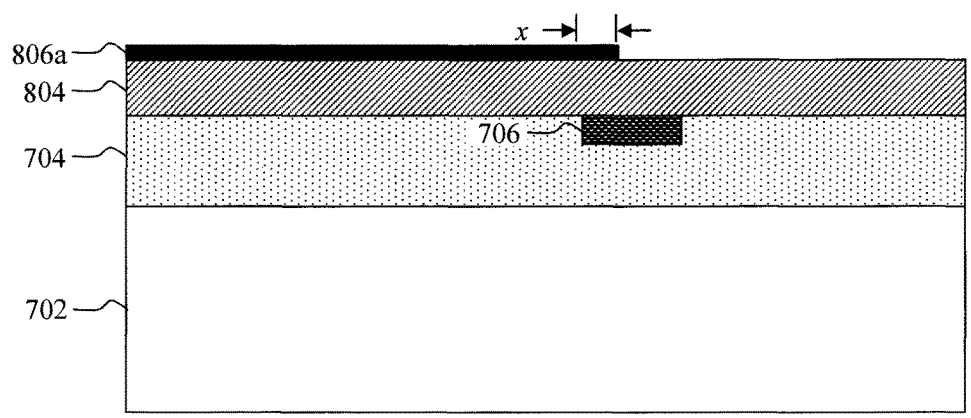
FIG. 9 is a cross-sectional diagram illustrating the layer of carbon nanotubes having been patterned to remove a portion of the layer over the back gate according to an embodiment of the present invention.

The layer of carbon nanotubes 806 is then patterned to remove a portion of the layer over the back gate 706. See FIG. 9. As shown in FIG. 9, this patterning serves to remove the layer of carbon nanotubes 806 from over the back gate 706. Since the layer of carbon nanotubes 806 was formed only to one side (i.e., in this case the emitter side) of the back gate, following patterning of the layer of carbon nanotubes 806, a portion 806a of the layer of carbon nanotubes 806 will be present only on that one side of the back gate 706. As shown in FIG. 9, it is permissible for the layer of carbon nanotubes 806 to slightly overlap the back gate 706 (e.g., an overlap x of from about 2 nm to about 10 nm, and ranges therebetween is permissible). See FIG. 9.

As will be described in detail below, in this particular example the portion 806a of the carbon nanotube layer will serve as emitter electrodes of the vacuum transistor device, and will be present on a (first) emitter side of the vacuum channel of the device. A metal contact on the opposite (second) collector side of the back gate/vacuum channel will serve as the collector electrode of the device.

As provided above, the layer of carbon nanotubes 806 can be patterned using standard photolithography (to form a patterned photoresist) followed by oxygen plasma etching to remove the uncovered portions of layer 806. The result is as shown in FIG. 9.

The vacuum channel is next formed in the gate dielectric 804 over the back gate 706. See FIG. 10. A second etching step (i.e., the first step being the etching of the carbon nanotube layer) is used to pattern the gate dielectric 804. As described above, the patterning of the gate dielectric 804 can be carried out using standard lithography and etching techniques to form the vacuum channel in the gate dielectric 804.

Figure 10:
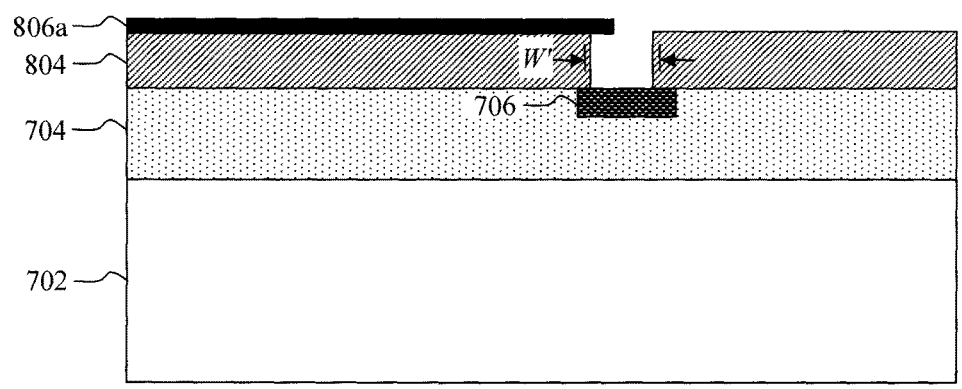
FIG. 10 is a cross-sectional diagram illustrating a vacuum channel having been formed in the gate dielectric over the back gate according to an embodiment of the present invention.

According to an exemplary embodiment, the vacuum channel is formed having a width W' that is greater than a gap G' separating the portion 806a of the carbon nanotube layer from the metal contact serving as the collector electrode (see below). To achieve this configuration, an isotropic etch process such as wet or chemical etching may be employed. Further, as shown in FIG. 10, an etch chemistry is chosen which is selective for the gate dielectric 804 vis-à-vis the insulating layer 704. According to an exemplary embodiment, the width W' of the vacuum channel is from about 10 nm to about 150 nm, and ranges therebetween.

Figure 11:
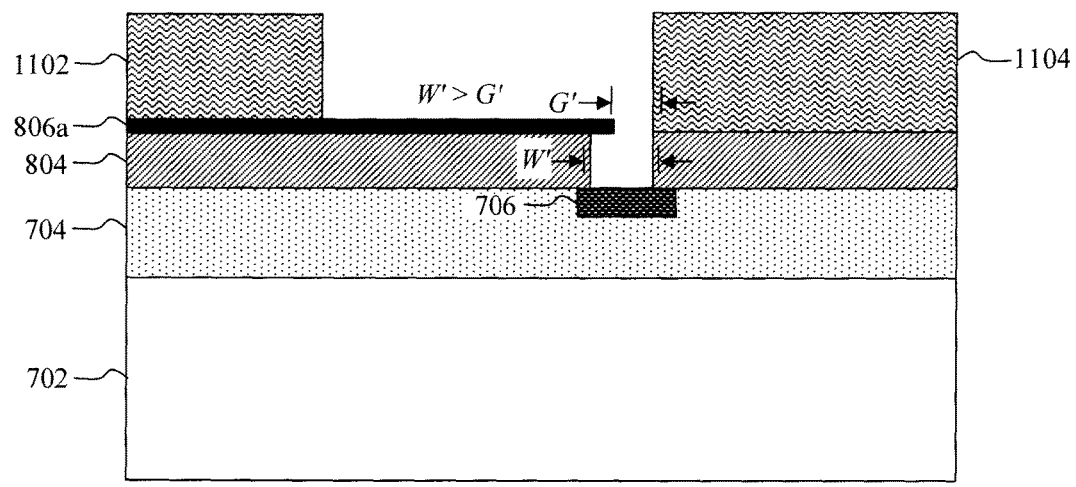
FIG. 11 is a cross-sectional diagram illustrating metal contacts having been formed on opposite sides of the back gate, wherein the metal contact on the side of the back gate opposite the layer of carbon nanotubes serves as the collector electrode of the device according to an embodiment of the present invention.

Next, metal contacts 1102 and 1104 are formed on opposite (i.e., first and second) sides of the back gate 706/vacuum channel. See FIG. 11. As shown in FIG. 11, the metal contact 1102 is formed to the portion 806a of the carbon nanotube layer (i.e., the portion of the carbon nanotube layer which will serve as the emitter electrode of the device) on the first side of the back gate 706/vacuum channel. The metal contact 1104 is formed on the gate dielectric on the second side of the back gate 706/vacuum channel. The metal contact 1104 will serve as a collector electrode of the device. As shown in FIG. 11, the portion 806a of the carbon nanotube layer and the metal contact 1104 are separated by a gap G'. According to an exemplary embodiment, G' is from about 5 nm to about 100 nm, and ranges therebetween. As provided above, the width W' of the vacuum channel can be greater than the gap G' separating the portion 806a of the carbon nanotube layer from the metal contact 1104.

As described above, any suitable metallization process may be employed to form the contacts 1102 and 1104, such as sputtering, evaporation, electroplating, etc. For instance, a lift-off process may be employed whereby a suitable contact metal (e.g., Pd, Rh, Ti, Cu, W, Ta, etc.) is deposited onto the structure through a mask. The mask can then be removed, and with it the excess metal.

During operation of the device, the emitter (i.e., portion 806a of the carbon nanotube layer) injects carriers into the vacuum channel. Movement of the carriers in the vacuum channel between the emitter and the collector (i.e., metal contact 1104) is regulated by the back gate 706.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a vacuum transistor, the method comprising the steps of:
    covering a substrate with an insulating layer;
    forming at least one back gate in the insulating layer;
    depositing a gate dielectric on the insulating layer over the back gate;
    forming a carbon nanotube layer on the gate dielectric over the back gate;
    patterning the carbon nanotube layer to provide a first portion of the carbon nanotube layer over a first side of the back gate and a second portion of the carbon nanotube layer over a second side of the back gate, wherein the first portion the carbon nanotube layer and the second portion of the carbon nanotube layer are separated from one another by a gap G, and wherein the first portion of the carbon nanotube layer serves as an emitter electrode of the vacuum transistor and the second portion of the carbon nanotube layer serves as a collector electrode of the vacuum transistor;
    forming a vacuum channel in the gate dielectric over the back gate, wherein the vacuum channel is formed in the gate dielectric using an isotropic etching process; and
    forming metal contacts to the emitter electrode and to the collector electrode.

2. The method of claim 1, wherein the at least one back gate comprises a metal back gate.

3. The method of claim 1, wherein a top surface of the at least one back gate is coplanar with a top surface of the insulating layer.

4. The method of claim 1, wherein the at least one back gate is embedded in the insulating layer with a portion of the insulating layer separating the back gate from the substrate.

5. The method of claim 1, wherein the carbon nanotube layer comprises either single-wall or multi-wall carbon nanotubes.

6. The method of claim 1, wherein the carbon nanotube layer is patterned using oxygen plasma etching.

7. The method of claim 1, wherein the gap G is from about 5 nm to about 100 nm, and ranges therebetween.

8. The method of claim 1, wherein the vacuum channel is formed having a width W of from about 10 nm to about 150 nm, and ranges therebetween.

9. The method of claim 8, wherein the width W is greater than the gap G.

10. A method for forming a vacuum transistor, the method comprising the steps of:
- covering a substrate with an insulating layer;
- forming at least one back gate in the insulating layer;
- depositing a gate dielectric on the insulating layer over the back gate;
- forming a carbon nanotube layer on the gate dielectric over the back gate;
- patterning the carbon nanotube layer to provide a portion of the carbon nanotube layer over only a first side of the back gate, wherein the portion of the carbon nanotube layer serves as an emitter electrode of the vacuum transistor;
- forming a vacuum channel in the gate dielectric over the back gate, wherein the vacuum channel is formed in the gate dielectric using an isotropic etching process;
- forming a first metal contacts to the emitter electrode; and
- forming a second metal contact on the gate dielectric over a second side of the back gate, wherein the second metal contact serves as a collector electrode of the vacuum transistor, and wherein the portion the carbon nanotube layer and the second metal contact are separated from one another by a gap G'.

11. The method of claim 10, wherein a top surface of the at least one back gate is coplanar with a top surface of the insulating layer.

12. The method of claim 10, wherein the at least one back gate is embedded in the insulating layer with a portion of the insulating layer separating the back gate from the substrate.

13. The method of claim 10, wherein the carbon nanotube layer is patterned using oxygen plasma etching.

14. The method of claim 10, wherein the gap G' is from about 5 nm to about 100 nm, and ranges therebetween.

15. The method of claim 10, wherein the vacuum channel is formed having a width W' of from about 10 nm to about 150 nm, and ranges therebetween.

16. The method of claim 15, wherein the width W' is greater than the gap G'.

* * * * *